Jan. 16, 1951 V. O. STOKES 2,538,539

AUTOMATIC TUNING SYSTEM

Filed Dec. 12, 1946

INVENTOR
Victor Owen Stokes
BY Harry Tunick
ATTORNEY

Patented Jan. 16, 1951 2,538,539

UNITED STATES PATENT OFFICE 2,538,539

AUTOMATIC TUNING SYSTEM

Victor Owen Stokes, Chelmsford, England, assignor, by mesne assignments, to Radio Corporation of America, New York, N. Y., a corporation of Delaware Application December 12, 1946, Serial No. 715,774
In Great Britain December 14, 1945

4 Claims. (Cl. 250—40)

This invention relates to automatic tuning systems and more particularly, though not exclusively, to systems for automatically tuning the radio frequency amplifier or other stage or stages of a radio transmitter. The invention provides improved automatic tuning systems of the kind in which the automatic tuning is effected by means of an electric motor or other operating device actuating a variable reactance or reactances for the circuit or circuits to be controlled.

According to this invention an automatic tuning system comprises a pair of controlling electron discharge tubes, each with an impedance in its cathode leg; means for feeding to control electrodes of said tubes an alternating voltage which is a function of the input alternating voltage to the circuit whose tuning is to be controlled; means for feeding to output electrodes of said controlling discharge tubes, alternating voltage which is a function of the output alternating voltage from the circuit whose tuning is to be controlled; and means actuated in dependence upon departures of the currents through the cathode leg impedances from a predetermined relationship for varying the tuning of the circuit to be controlled in such sense as to restore said relationship, the arrangement being such that for correct tuning there is phase quadrature or nearly phase quadrature between the voltages on the control and output electrodes of each of the controlling tubes, any departure from correct tuning causing oppositely directed shifts in the input-output electrode phase relation of the two controlling tubes.

In the preferred embodiments of the invention alternating voltage derived from a high frequency input to a tube or tubes in the circuit whose tuning is to be controlled, is shifted in phase through substantially 90 degrees, and fed in parallel to the control electrodes of the controlling tubes, and alternating voltage derived from the output circuit of the tube or tubes in the circuit to be controlled, is fed in phase opposition to output electrodes of the controlling tubes, the cathode leg impedances being substantially equal so that for correct tuning the cathode leg impedance currents are substantially identical, while departures from correct tuning will upset the balance of the said currents in a direction depending upon the sense of departure.

Preferably the cathode leg impedances are adjustable to allow correct balance to be obtained despite unavoidable practical departures from the theoretically ideal phase relationship required.

Figure 1:
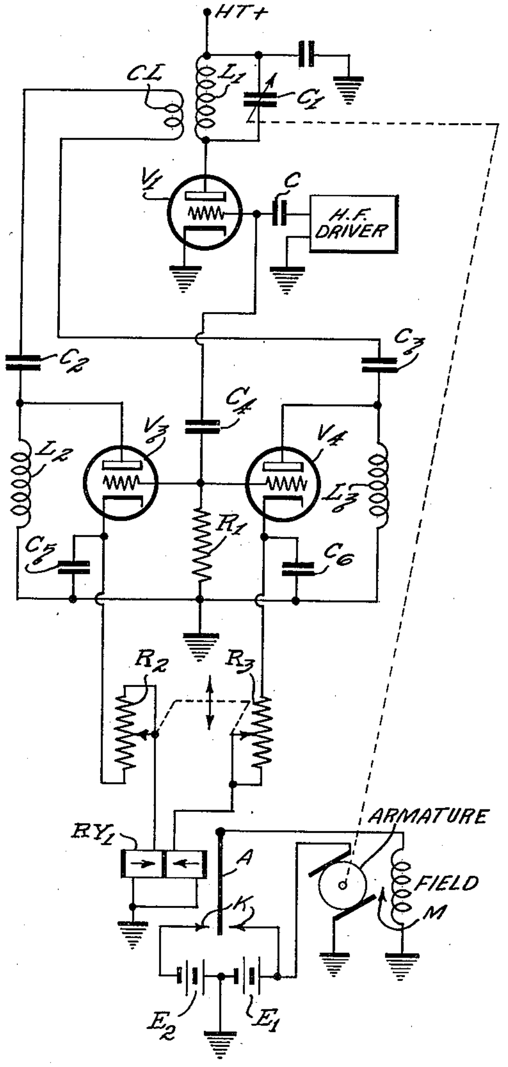
Figure 2:
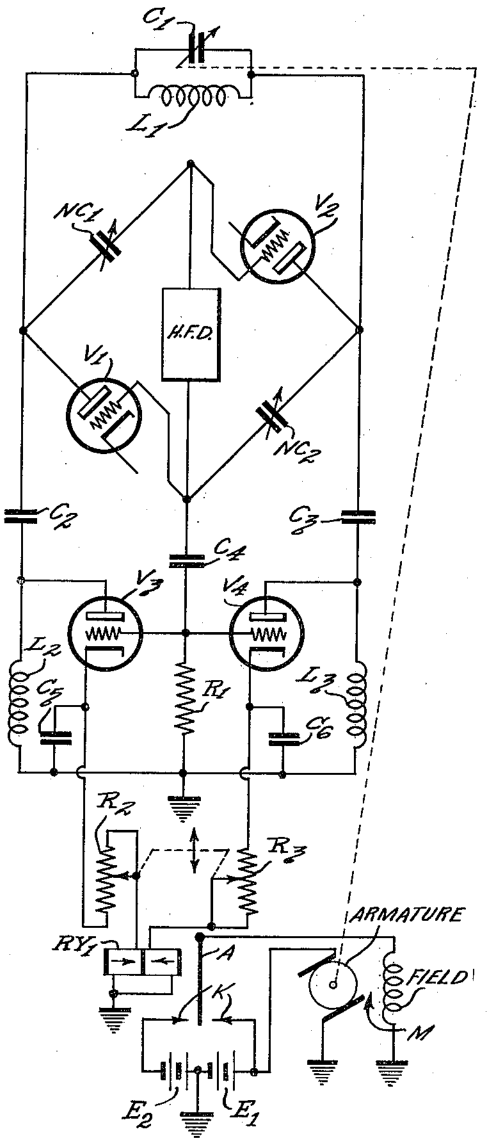

The invention is illustrated in the accompanying drawing, in which Figs. 1 and 2 are diagrams of two different circuit embodiments of the invention.

Referring to Fig. 1, a high frequency amplifier tube V1 of a radio transmitter receives on its control grid the customary high frequency drive from a driver through a condenser C. The anode circuit of tube V1 includes the parallel tuned circuit L1 C1 whose tuning can be adjusted by varying the capacitance of the condenser therein. Coupled to the inductance of this tuned circuit is a coil CL whose ends are connected, each through a respective similar anode coupling condenser C2 and C3, to the anode of a respective one of a pair of similar controlling electron discharge tubes V3 or V4. The anodes of the said controlling electron discharge tubes are also connected, each through its own inductance L2 or L3, to ground, these inductances thus providing D. C. paths to the two anodes. A connection is taken from the grid of the high frequency amplifier tube V1 through a grid coupling condenser C4 to the control grids of the controlling tubes, these latter grids being directly connected together and also connected to ground through a resistance R1. The cathodes of the controlling tubes are connected to ground each through a circuit comprising in series an adjustable cathode leg resistance R2 or R3 and one or the other windings of a differential relay $RY_1$. Differential relay $RY_1$ includes an armature A which makes contact with one or the other of a pair of contacts K according to whether one or the other of the two windings of the relay is energized more strongly, the armature A touching neither contact when the windings are equally energized. Armature A is connected to the field winding of an electric motor M, while contacts K are connected to suitable voltage sources E1 and E2, of opposite polarities with respect to ground, to supply voltages of opposite polarities to the motor field winding when armature A engages one of the contacts K. The armature of the motor M is supplied suitably from the voltage source E1 as shown, so that the motor armature is caused to rotate in one direction or the other dependent on which contact K relay armature A engages. The radio frequency tuning condenser $C_1$ is driven mechanically by the armature of motor M, as indicated by the dotted line, so that the capacitance of this condenser is varied by operation of this motor. The two adjustable resistances R2 and R3 are subjected to manual differential uni-control, as indicated by a dotted line, in such manner that a single control handle imparts equal and opposite adjustment to the two resistances. The cathodes of the controlling valves are also connected to ground through respective radio frequency bypass condensers C5 and C6.

With this arrangement the high frequency voltage applied between the grids of the controlling tubes V3 and V4 and ground will be substantially in phase quadrature with the high frequency voltage on the grid of the high frequency amplifier tube V1. There will be a slight departure from exact phase quadrature due to the inter-electrode capacities of the controlling tubes, but this slight misphase can be cancelled out by adjustment of the adjustable cathode leg resistances R2 or R3, as will be seen later. The high frequency voltages fed to the anodes of the controlling tubes will be in phase opposition and will, of course, be a certain proportion of the output voltage from the high frequency amplifier.

Ignoring for a moment the effects of the inter-electrode capacities of the controlling tubes, it will be seen that so long as the input-output phase relation of the high frequency currents of the amplifier tube $V_1$ corresponds to correct tuning, the currents through the cathode leg impedances R2 and R3 (assuming these to be equal) will be the same, and for this condition the relay is adapted to leave its control circuits open so that the motor M is stationary. Any departure from this correct condition will cause one or other of the cathode leg currents to predominate (according to the sense of departure) and the relay will close one or the other of its contacts K to complete the motor field circuit, in one or the other polarity, causing the motor armature to rotate to vary the tuning of condenser $C_1$ in the correct direction.

As already stated, the inter-electrode capacities in the controlling tubes will in practice prevent the exact quadrature relation being obtained. This difficulty, however, is taken into account by the provision of equal and opposite adjustment for the cathode leg resistances R2 and R3, these being adjusted until accurate balance in the correct tuning position is obtained despite any departure (when the tuning is correct) from the theoretically ideal quadrature relationship.

The invention is not limited, in its application, to a single sided amplifier as above described, but is applicable to other circuits, for example to push-pull amplifiers. In one push-pull arrangement, illustrated in Fig. 2, there are two high frequency amplifiers V1 and V2 with the high frequency drive applied from a driver HFD in push-pull on the grids. The terminal of the drive source corresponding to one grid is connected through a grid coupling condenser C4 to the common grid points of a pair of controlling discharge tubes V3 and V4; the anodes of the high frequency amplifier tubes V1 and V2 are connected to opposite ends of the anode tuning circuit L1, C1 which is to be controlled; the said anodes are also connected, each through its own anode coupling condenser C2 or C3, to the anode of one or the other of the controlling discharge tubes V3 and V4; and neutralizing condensers NC1 and NC2 are provided between the anode of each amplifier tube and the grid of the other. The remainder of the controlling discharge tube circuit is as in Fig. 1 and, it is thought, will require no further description to be understood.

Having now particularly described and ascertained the nature of my said invention and in what manner the same is to be performed I declare that what I claim is:

1. In an automatic tuning system for an electron discharge device having input electrodes excited by alternating current and output electrodes including a tunable circuit tuned substantially to the frequency of said alternating current, a pair of controlling electron discharge tubes each having an anode, a cathode and a control grid, an impedance in the cathode return circuit of each tube, a connection coupling the control grids of the tubes of said pair of tubes co-phasally to the input electrodes of said first named device, a circuit coupling the anode electrodes of the tubes of said pair of tubes differentially to said tunable circuit, and means for utilizing the difference in potentials developed across said cathode impedances for tuning said tunable circuit.

2. In an automatic tuning system for an electron discharge device having input electrodes excited by alternating current and output electrodes including a tunable circuit tuned substantially to the frequency of said alternating current, a pair of controlling electron discharge tubes each having an anode, a cathode and a control grid, a relay winding in the cathode return circuit of each tube, a common core for said windings, the windings being disposed on said core so that current therethrough develops fields of opposed sense, a connection coupling the control grids of the tubes of said pair of tubes cophasally to the input electrodes of said device, a circuit coupling the anode electrodes of the tubes of said pair of tubes anti-phasally to said tunable circuit, a reversible motor, means driven by said motor for tuning said tunable circuit, and apparatus controlled by the fields developed by current through said windings for controlling the direction of rotation of said motor.

3. In an automatic system for tuning a tunable circuit, means for supplying alternating current to said circuit, a pair of controlling electrode structures each having an anode, a cathode and a control electrode, an impedance in the cathode return circuit of each structure, connections for coupling the control electrodes of said pair of structures together and to said supplying means for applying alternating current from such means cophasally to said control electrodes, connections for coupling the anodes of said pair of structures to said tunable circuit for applying alternating current from such circuit anti-phasally to said anodes, and apparatus for utilizing the difference in potentials developed across said cathode impedances for tuning said tunable circuit.

4. A tuning system as recited in claim 3 wherein said apparatus includes a relay coupled to said impedances to be operated by a difference in potentials thereacross, a motor controlled differentially by said relay, and means driven by said motor for tuning the tunable circuit.

VICTOR OWEN STOKES.

REFERENCES CITED

The following references are of record in the file of this patent:

UNITED STATES PATENTS

| Number | Name | Date |
|---|---|---|
| 1,620,204 | Heising | Mar. 8, 1927 |
| 1,919,976 | Fitz Gerald | July 25, 1933 |
| 2,304,377 | Roberts | Dec. 8, 1942 |
| 2,387,544 | Usselman | Oct. 23, 1945 |